US010971540B2

(12) United States Patent
Bornfreund et al.

(10) Patent No.: US 10,971,540 B2
(45) Date of Patent: Apr. 6, 2021

(54) METHOD AND SYSTEMS FOR COUPLING SEMICONDUCTOR SUBSTRATES

(71) Applicant: FLIR Systems, Inc., Wilsonville, OR (US)

(72) Inventors: Richard E. Bornfreund, Santa Barbara, CA (US); Joseph H. Durham, Santa Barbara, CA (US)

(73) Assignee: FLIR SYSTEMS, INC., Wilsonville, OR (US)

(*) Notice: Subject to any disclaimer, the term of this patent is extended or adjusted under 35 U.S.C. 154(b) by 0 days.

(21) Appl. No.: 15/287,636

(22) Filed: Oct. 6, 2016

(65) Prior Publication Data

US 2017/0025453 A1    Jan. 26, 2017

Related U.S. Application Data

(63) Continuation of application No. PCT/US2015/024370, filed on Apr. 3, 2015.
(Continued)

(51) Int. Cl.
*H01L 27/146*     (2006.01)
*H01L 21/027*     (2006.01)
(Continued)

(52) U.S. Cl.
CPC ...... *H01L 27/1465* (2013.01); *H01L 21/0272* (2013.01); *H01L 21/32133* (2013.01); *H01L 21/32136* (2013.01); *H01L 23/544* (2013.01); *H01L 24/11* (2013.01); *H01L 27/1469* (2013.01); *H01L 27/14634* (2013.01); *H01L 27/14636* (2013.01); *H01L 27/14689* (2013.01);
(Continued)

(58) Field of Classification Search
CPC .............. H01L 23/544; H01L 24/11; H01L 2224/13109; H01L 21/32139; H01L 2224/10–13; G03F 9/7084
See application file for complete search history.

(56) References Cited

U.S. PATENT DOCUMENTS 5,068,007 A * 11/1991 Rogers .............. H01L 21/02019
                                              204/192.35
5,304,500 A *  4/1994 Timlin ............... H01L 27/1465
                                              257/443
6,642,136 B1   11/2003 Lee et al.
8,179,529 B1 *  5/2012 Berry .................. G01B 11/272
                                              356/399
2006/0138657 A1* 6/2006 Kushima ............ H01L 21/6835
                                              257/737
(Continued)

FOREIGN PATENT DOCUMENTS

CN   102054667 A  *  5/2011
GB      2307785       6/1997
(Continued)

*Primary Examiner* — Alia Sabur
(74) *Attorney, Agent, or Firm* — Haynes and Boone, LLP (57) ABSTRACT

Systems and methods may be provided for coupling together semiconductor devices. One or more of the semiconductor devices may be provided with an array of bump contacts formed in an etch back process. The bump contacts may be indium bumps. The indium bumps may be formed by depositing a sheet of indium onto a surface of a device substrate, depositing and patterning a layer of photoresist over the indium layer, and selectively etching the indium layer to the surface of the substrate using the patterned photoresist layer to form the indium bumps. The substrate may be an infrared detector substrate. The infrared detector substrate may be coupled to a readout integrated circuit substrate using the bumps.

20 Claims, 9 Drawing Sheets

Related U.S. Application Data (60) Provisional application No. 61/976,357, filed on Apr. 7, 2014.

(51) Int. Cl.
    *H01L 21/3213*     (2006.01)
    *H01L 23/00*     (2006.01)
    *H01L 23/544*     (2006.01)

(52) U.S. Cl.
    CPC .... *H01L 24/13* (2013.01); *H01L 2223/54426* (2013.01); *H01L 2224/119* (2013.01); *H01L 2224/1147* (2013.01); *H01L 2224/11622* (2013.01); *H01L 2224/13023* (2013.01); *H01L 2224/13109* (2013.01); *H01L 2224/14135* (2013.01); *H01L 2224/14136* (2013.01); *H01L 2224/14177* (2013.01); *H01L 2224/16145* (2013.01); *H01L 2224/81191* (2013.01); *H01L 2224/81193* (2013.01)

(56) References Cited

U.S. PATENT DOCUMENTS

| | | | |
|---|---|---|---|
| 2007/0224722 A1* | 9/2007 | Matthews | H01L 24/11 |
| | | | 438/64 |
| 2008/0237762 A1 | 10/2008 | Swain et al. | |
| 2008/0251951 A1* | 10/2008 | Holscher | H01L 23/544 |
| | | | 257/797 |
| 2011/0147707 A1 | 6/2011 | Inada et al. | |
| 2011/0221024 A1* | 9/2011 | Bornfreund | H01L 31/03046 |
| | | | 257/437 |
| 2012/0313236 A1 | 12/2012 | Wakiyama et al. | |
| 2013/0037603 A1* | 2/2013 | Choi | H01L 23/49816 |
| | | | 228/203 |

FOREIGN PATENT DOCUMENTS

| | | |
|---|---|---|
| RU | 2492545 C1 * | 9/2013 |
| WO | WO 2007043718 | 4/2007 |

* cited by examiner

METHOD AND SYSTEMS FOR COUPLING SEMICONDUCTOR SUBSTRATES

CROSS-REFERENCE TO RELATED APPLICATIONS

This application is a continuation of International Application No. PCT/US15/24370 filed Apr. 3, 2015 and entitled "METHODS AND SYSTEMS FOR COUPLING SEMICONDUCTOR SUBSTRATES" which claims priority to and the benefit of U.S. Provisional Patent Application No. 61/976,357 filed Apr. 7, 2014 and entitled "METHODS AND SYSTEMS FOR COUPLING SEMICONDUCTOR SUBSTRATES," which are hereby incorporated by reference in their entirety.

TECHNICAL FIELD

One or more embodiments of the invention relate generally to infrared cameras and, more particularly, bump connectors for infrared cameras.

BACKGROUND

During fabrication of some types of semiconductor devices, it can be desirable to mate or couple one semiconductor device to another. The mated semiconductor devices are mated to physically attach the devices to each other and to provide a large number of electrical interconnects between the mated semiconductor devices (e.g., to allow electrical conduction of signals between the semiconductor devices).

For example, infrared components may use this type of interconnect technology, with one semiconductor device optimized to perform a detection function (e.g., an infrared detector) and the other semiconductor device optimized to perform detector biasing, signal integration, signal processing, and/or multiplexing functions (e.g., a read-out integrated circuit (ROIC)). The interconnect array for these devices physically and electrically interconnects the infrared detector to the ROIC, with the interconnect array typically forming thousands to millions of electrical interconnects.

For example, one type of imaging device uses a focal plane array (FPA) to detect infrared radiation. An FPA is typically formed from a detector device having an array of infrared detector elements, with each infrared detector element functioning as a pixel to produce a two-dimensional image, and a mated ROIC. A change in a signal level output of each infrared detector element due to corresponding changes in received incident infrared radiation is translated into a time-multiplexed electrical signal by the readout integrated circuit (ROIC). The combination of the ROIC and the infrared detector array is commonly known as a FPA or infrared FPA. FPAs (e.g., microbolometer FPAs) are described in further detail in U.S. Pat. Nos. 5,756,999, 6,028,309, and 6,852,976, which are herein incorporated by reference in their entirety.

In a typical semiconductor mating approach, the array of electrical interconnects includes indium bump interconnects formed in a wafer level process that grows the indium bumps in place either by thermally evaporating the indium bumps through a photoresist liftoff layer or using a plating process to provide bump material into openings in a photoresist layer as described in further detail in U.S. Pat. No. 7,884,485 issued Feb. 8, 2011 which is herein incorporated by reference in its entirety. A potential drawback of these conventional approaches is that, if care is not taken, control of the indium bump uniformity (e.g., the post liftoff uniformity) can vary depending on the indium bump height, indium bump base width, photoresist geometry, and/or pattern loading effects (i.e., pattern loading effects in a plating process). In these approaches, if care is not taken, as the pitch of the detectors becomes smaller, bump non-uniformities can increasingly negatively affect the detector yield.

As a result, there is a need for improved techniques for forming interconnects between semiconductor devices.

SUMMARY

Systems and methods are disclosed for joining semiconductor devices in accordance with one or more embodiments of the present invention. For example in accordance with an embodiment, techniques are disclosed for forming contact arrays on a semiconductor devices using an etch back process. A resulting device formed by mating the contacts of the semiconductor device to contacts of an additional semiconductor device, may provide various advantages over conventional approaches in terms of increased contact uniformity and resulting increases in device yield, particularly for devices with relatively small contact pitch.

More specifically, in accordance with one embodiment of the present invention, a method of forming interconnects on a semiconductor device includes providing a semiconductor substrate such as a semiconductor substrate wafer having alignment marks, forming a first layer of photoresist on the substrate, patterning the first layer of photoresist to remove a first portion of the first layer of photoresist and to leave a second portion of the first layer of photoresist covering the alignment marks, forming a metal layer on the substrate and over the remaining second portion of the first layer of photoresist, lifting off a portion of the metal layer by removing the remaining second portion of the first layer of photoresist, forming a second layer of photoresist on the metal layer, patterning the second layer of photoresist using the alignment marks, and selectively etching the metal layer using the patterned second layer of photoresist to form bumps on the substrate.

In accordance with an embodiment, the metal layer may be an indium layer having a uniform thickness. In accordance with an embodiment, the metal layer may be a multi-metal stack that includes a combination of titanium, nickel, nickel alloys, platinum, gold and an indium layer each having a uniform thickness.

In accordance with an embodiment, the substrate may include a plurality of conductive vias. The etching may form the bumps on corresponding ones of the conductive vias. The vias may be formed in an overglass layer on the substrate.

In accordance with an embodiment, the substrate may include a plurality of conductive vias. The etching may form a self-aligned metal stack and the bumps on corresponding ones of the conductive vias. The vias may be formed in an overglass layer on the substrate. The self-aligned metal stack may be formed below the bumps on corresponding ones of the conductive vias.

In accordance with an embodiment, the substrate may be an infrared detector substrate. The infrared detector may be composed of or grown on an infrared substrate such as InSb, HgCdTe, CdTe, InP, InGaAs, GaAs, GaSb, ceramics, or glasses.

In accordance with an embodiment, the substrate may be a readout integrated circuit substrate. The ROIC substrate may be formed from silicon or germanium. In accordance with an embodiment, the substrate may be a printed circuit substrate such as circuit board formed from ceramics or metalized ceramics.

In accordance with an embodiment, following formation of the bumps, the wafer may be diced to singulate individual semiconductor devices from the wafer. Each individual semiconductor device may be mated with a corresponding additional semiconductor device by coupling the bumps on each individual semiconductor device with associated electrical contacts such as bumps or pads on the corresponding additional semiconductor device. For example, the individual semiconductor devices may be infrared detector devices and the corresponding additional semiconductor devices may be readout integrated circuit devices.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Systems and methods are disclosed herein to provide semiconductor devices with improved bump contacts in accordance with one or more embodiments. The bump contacts may be formed on one or more semiconductor substrates in, for example, a wafer level etch back process. The bump contacts may be formed, for example, from indium or other materials as would be understood by one skilled in the art. In one embodiment, an array of such indium bumps may be used to mechanically and/or electrically couple an infrared detector to a readout integrated circuit in an infrared detector device. The infrared detector device may be included in an electronic device or other imaging system.

Figure 1:
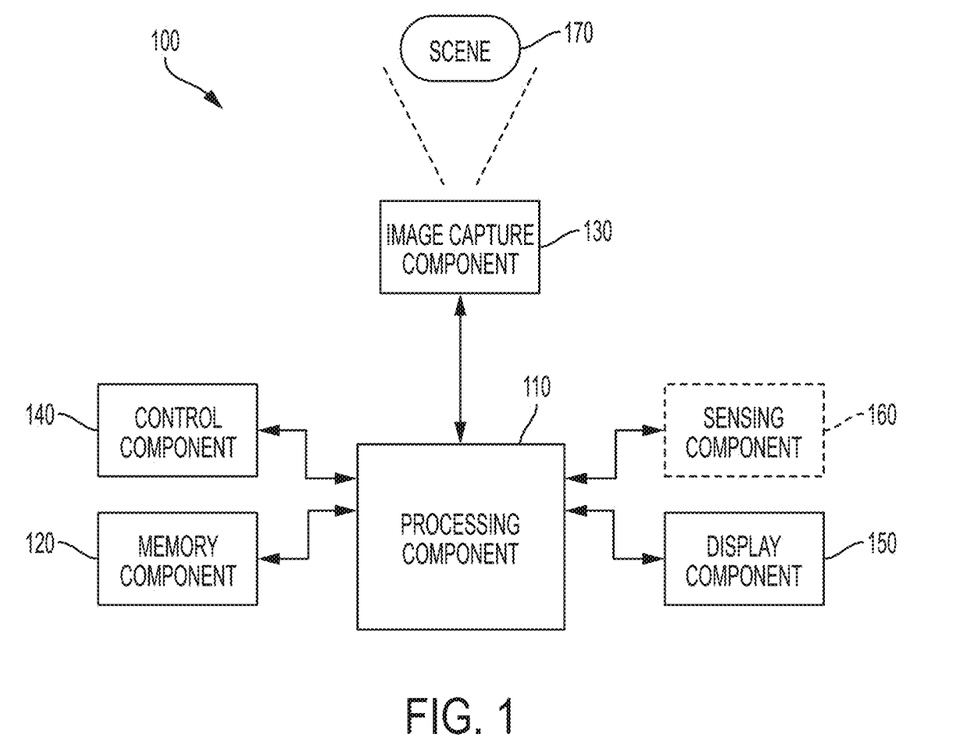
FIG. 1 shows a block diagram illustrating a system for capturing images in accordance with an embodiment.

Referring now to FIG. 1, a block diagram is shown illustrating a system 100 (e.g., an infrared camera) for capturing and processing images in accordance with one or more embodiments. System 100 may include, in one implementation, a processing component 110, a memory component 120, an image capture component 130, a control component 140, and a display component 150. Optionally, system 100 may include a sensing component 160.

System 100 may represent for example an infrared imaging device, such as an infrared camera, to capture and process images, such as video images of a scene 170. The system 100 may represent any type of infrared camera adapted to detect infrared radiation and provide representative data and information (e.g., infrared image data of a scene) or may represent more generally any type of electro-optical sensor system. System 100 may comprise a portable device and may be incorporated, e.g., into a vehicle (e.g., an automobile or other type of land-based vehicle, an aircraft, a marine craft, or a spacecraft) or a non-mobile installation requiring infrared images to be stored and/or displayed or may comprise a distributed networked system.

In various embodiments, processing component 110 may comprise any type of a processor or a logic device (e.g., a programmable logic device (PLD) configured to perform processing functions). Processing component 110 may be adapted to interface and communicate with components 120, 130, 140, and 150 to perform method and processing steps and/or operations, as described herein such as controlling biasing and other functions (e.g., values for elements such as variable resistors and current sources, switch settings for timing such as for switched capacitor filters, ramp voltage values, etc.) along with conventional system processing functions as would be understood by one skilled in the art.

Memory component 120 comprises, in one embodiment, one or more memory devices adapted to store data and information, including for example infrared data and information. Memory device 120 may comprise one or more various types of memory devices including volatile and non-volatile memory devices. Processing component 110 may be adapted to execute software stored in memory component 120 so as to perform method and process steps and/or operations described herein.

Image capture component 130 comprises, in one embodiment, any type of image sensor, such as for example one or more infrared sensors (e.g., any type of multi-pixel infrared detector, such as a focal plane array with photodiodes and bump contacts as described herein) for capturing infrared image data (e.g., still image data and/or video data) representative of an image, such as scene 170. In one implementation, the infrared sensors of image capture component 130 provide for representing (e.g., converting) the captured image data as digital data (e.g., via an analog-to-digital converter included as part of the infrared sensor or separate from the infrared sensor as part of system 100). In one aspect, the infrared image data (e.g., infrared video data) may include non-uniform data (e.g., real image data) of an image, such as scene 170. Processing component 110 may be adapted to process the infrared image data (e.g., to provide processed image data), store the infrared image data in memory component 120, and/or retrieve stored infrared image data from memory component 120. For example, processing component 110 may be adapted to process infrared image data stored in memory component 120 to provide processed image data and information (e.g., captured and/or processed infrared image data).

Control component 140 may include, in one embodiment, a user input and/or interface device, such as a rotatable knob (e.g., potentiometer), push buttons, slide bar, keyboard, etc., that is adapted to generate a user input control signal. Processing component 110 may be adapted to sense control input signals from a user via control component 140 and respond to any sensed control input signals received therefrom. Processing component 110 may be adapted to interpret such a control input signal as a parameter value, as generally understood by one skilled in the art.

In one embodiment, control component 140 may include a control unit (e.g., a wired or wireless handheld control unit) having push buttons adapted to interface with a user and receive user input control values. In one implementation, the push buttons of the control unit may be used to control various functions of the system 100, such as autofocus, menu enable and selection, field of view, brightness, contrast, noise filtering, high pass filtering, low pass filtering, and/or various other features as understood by one skilled in the art.

Display component 150 may include, in one embodiment, an image display device (e.g., a liquid crystal display (LCD) or various other types of generally known video displays or monitors). Processing component 110 may be adapted to display image data and information on the display component 150. Processing component 110 may be adapted to retrieve image data and information from memory component 120 and display any retrieved image data and information on display component 150. Display component 150 may include display electronics, which may be utilized by processing component 110 to display image data and information (e.g., infrared images). Display component 150 may be adapted to receive image data and information directly from image capture component 130 via the processing component 110, or the image data and information may be transferred from memory component 120 via processing component 110.

Optional sensing component 160 may include, in one embodiment, one or more sensors of various types, depending on the application or implementation requirements, as would be understood by one skilled in the art. The sensors of optional sensing component 160 provide data and/or information to at least processing component 110. In one aspect, processing component 110 may be adapted to communicate with sensing component 160 (e.g., by receiving sensor information from sensing component 160) and with image capture component 130 (e.g., by receiving data and information from image capture component 130 and providing and/or receiving command, control, and/or other information to and/or from one or more other components of system 100).

In various implementations, sensing component 160 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder), and/or whether a tunnel or other type of enclosure has been entered or exited. Sensing component 160 may represent conventional sensors as generally known by one skilled in the art for monitoring various conditions (e.g., environmental conditions) that may have an effect (e.g., on the image appearance) on the data provided by image capture component 130.

In some implementations, optional sensing component 160 (e.g., one or more of sensors) may include devices that relay information to processing component 110 via wired and/or wireless communication. For example, optional sensing component 160 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques.

In various embodiments, components of system 100 may be combined and/or implemented or not, as desired or depending on the application or requirements, with system 100 representing various functional blocks of a related system. In one example, processing component 110 may be combined with memory component 120, image capture component 130, display component 150, and/or optional sensing component 160. In another example, processing component 110 may be combined with image capture component 130 with only certain functions of processing component 110 performed by circuitry (e.g., a processor, a microprocessor, a logic device, a microcontroller, etc.) within image capture component 130. Furthermore, various components of system 100 may be remote from each other (e.g., image capture component 130 may comprise a remote sensor with processing component 110, etc. representing a computer that may or may not be in communication with image capture component 130).

Figure 2:
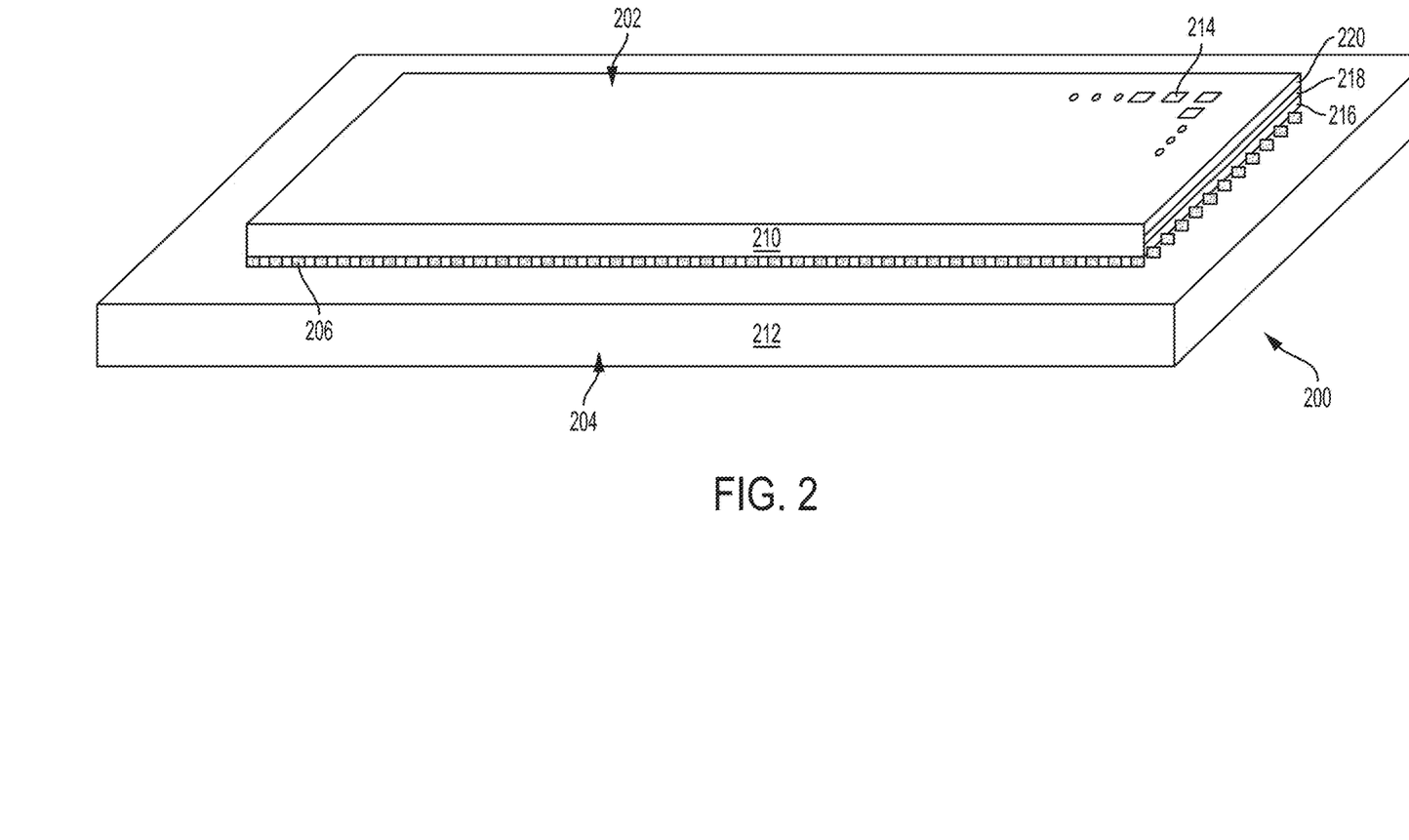
FIG. 2 shows a perspective view illustrating a focal plane array with bump connectors in accordance with an embodiment.

FIG. 2 shows a perspective view illustrating first and second semiconductor devices coupled together using an array of electrical contacts formed between the semiconductor devices in which the electrical contacts have been formed at least partially using an etch back process. As shown in FIG. 2, a device 200 (e.g., a hybrid semiconductor device) may be formed from a first semiconductor device such as semiconductor device 202 formed on a first semiconductor substrate 210 and a second semiconductor device 204 formed on a second semiconductor substrate 212 coupled together by an array of electrical contacts 206 disposed between the first and second semiconductor devices.

For example, electrical contacts 206 may each include a bump contact (sometimes referred to as a bump bond) formed from a conductive material such as indium, gold, other metals, alloys, or other conductive materials. The bump contacts may have an increased uniformity with respect to conventional bump contacts due to formation in an etch back bump formation process.

In one suitable configuration that is sometimes discussed herein as an example, a hybrid semiconductor device such as device 200 may be an infrared detector package such as a focal plane array that may be implemented in, for example, image capture component 130 of FIG. 1. In a focal plane array configuration for device 200, first semiconductor device 202 may be an infrared detector device and second semiconductor device 204 may be a readout integrated circuit operably coupled to the infrared detector device by the array of contacts 206.

In a focal plane array configuration for device 200, substrate 210 may include one or more layers of material such as layers 216, 218, and 220. For example, in a focal plane array configuration, substrate 210 may be an infrared detector formed from an infrared substrate or a film grown on a substrate, such as indium antimonide (InSb), mercury cadmium telluride (HgCdTe), cadmium telluride (CdTe), indium gallium arsenide (InGaAs), indium phosphide (InP), gallium arsenide (GaAs), gallium antimonide (GaSb), ceramics, or glasses (as examples) and layers 216, 218, and 220 may include one or more absorber layers, one or more passivation layers, one or more overglass layers, one or more antireflective layers, and/or other layers or elements. In one embodiment, layer 216 may be an overglass layer.

In a focal plane array configuration, substrate 212 may be an ROIC substrate formed from silicon or germanium (as examples). In this configuration, device 202 may include an array of infrared detector elements 214 that convert incident light such as infrared light into detectable electrical signals. Each infrared detector element 214 may be coupled via a corresponding one of contacts 206 to an associated unit cell (not shown) formed on substrate 212 of a readout integrated circuit for processing and reading out the electrical signals.

It should be appreciated that the example in which device 200 is a focal plane array is merely illustrative and that contacts 206 may be used to operably couple any suitable device substrates. For example, in accordance with an embodiment, one or both of substrates 210 and 212 may be a circuit board such as circuit board formed from ceramics or metalized ceramics.

Figure 3:
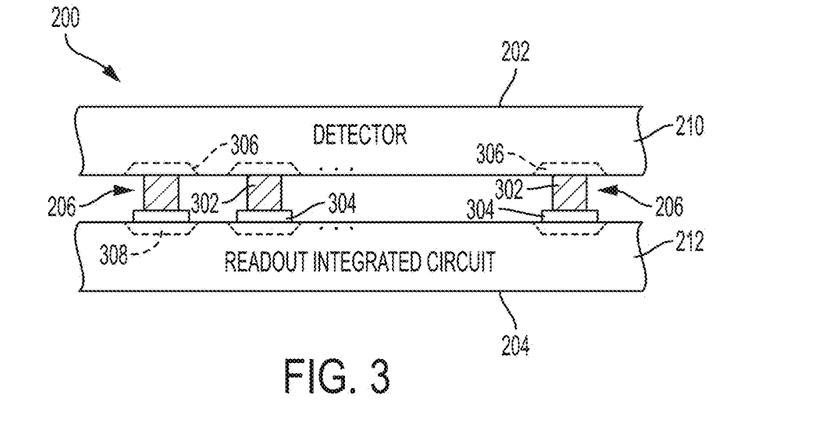
FIG. 3 shows a cross-sectional view of a device having a detector substrate coupled to a readout integrated circuit substrate using bump contacts on the detector substrate in accordance with an embodiment.
Figure 4:
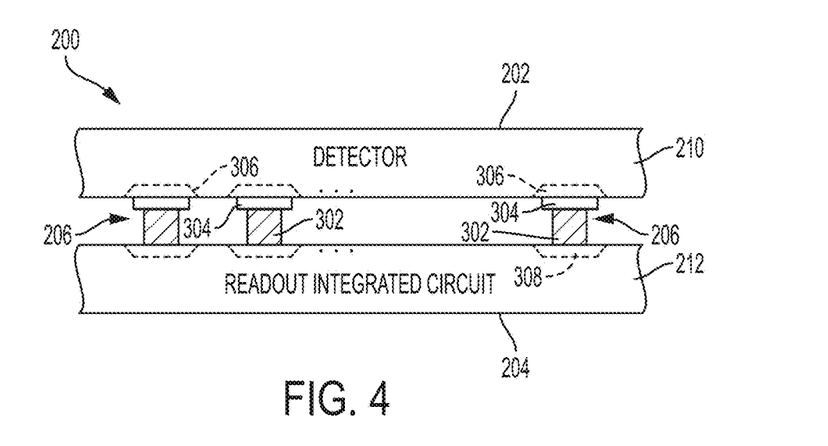
FIG. 4 shows a cross-sectional view of a device having a detector substrate coupled to a readout integrated circuit substrate using bump contacts on the readout integrated circuit substrate in accordance with an embodiment.
Figure 5:
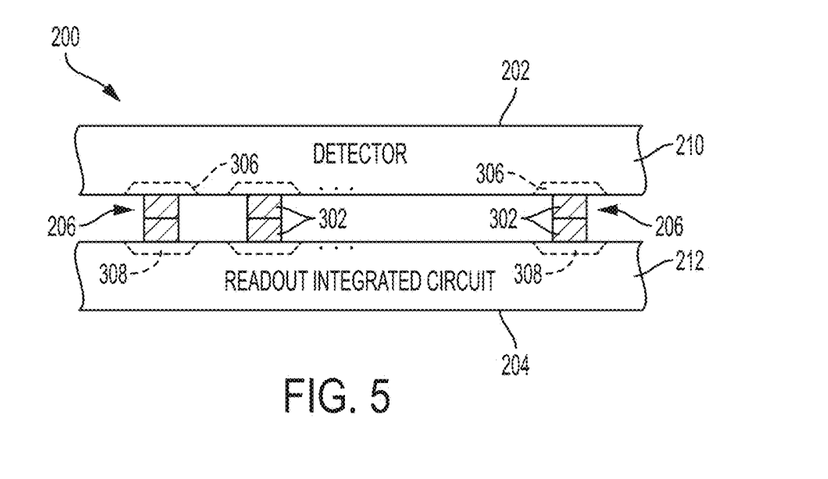
FIG. 5 shows a cross-sectional view of a device having a detector substrate coupled to a readout integrated circuit substrate using bump contacts on the detector substrate and bump contacts on the readout integrated circuit substrate in accordance with an embodiment.

In various embodiments, electrical contacts 206 may include bump contacts formed on one or both of substrates 210 and/or 212 as shown in FIGS. 3, 4, and 5. For example, in the embodiment shown in FIG. 3, contacts 206 may include bump contacts 302 on substrate 210 that are coupled to corresponding contact pads 304 on substrate 212. As shown in FIG. 3, bump contacts 302 may be formed on a surface of substrate 210 and conductively coupled to circuitry 306 that extends into substrate 210. For example, circuitry 306 may represent a portion of a conductive via that extends from a junction within substrate 210 through an overglass layer (see, e.g., layer 216 of FIG. 2) formed on substrate 210 to bump contacts 302. However, this is merely illustrative. In some configurations, circuitry 306 may include a conductive pad formed on the surface of substrate 210 or may include any other suitable circuitry for coupling to bumps 302.

Contact pads 304 may be formed on a surface of substrate 212 and coupled to circuitry 308 (e.g., conductive vias) that extend into substrate 212. However, this is merely illustrative. In various embodiments, bumps 302 may be coupled to any suitable circuitry on readout integrated circuitry 204 for reading out and/or processing electrical signals from detector device 202.

In the embodiment shown in FIG. 4, bump contacts 302 are formed on substrate 212 and coupled to contact pads 304 that are formed on substrate 210. In the embodiment shown in FIG. 5, both substrate 210 and substrate 212 include bump contacts 302 formed thereon that are conductively coupled to corresponding bump contacts 302 on the opposing substrate.

Figure 6:
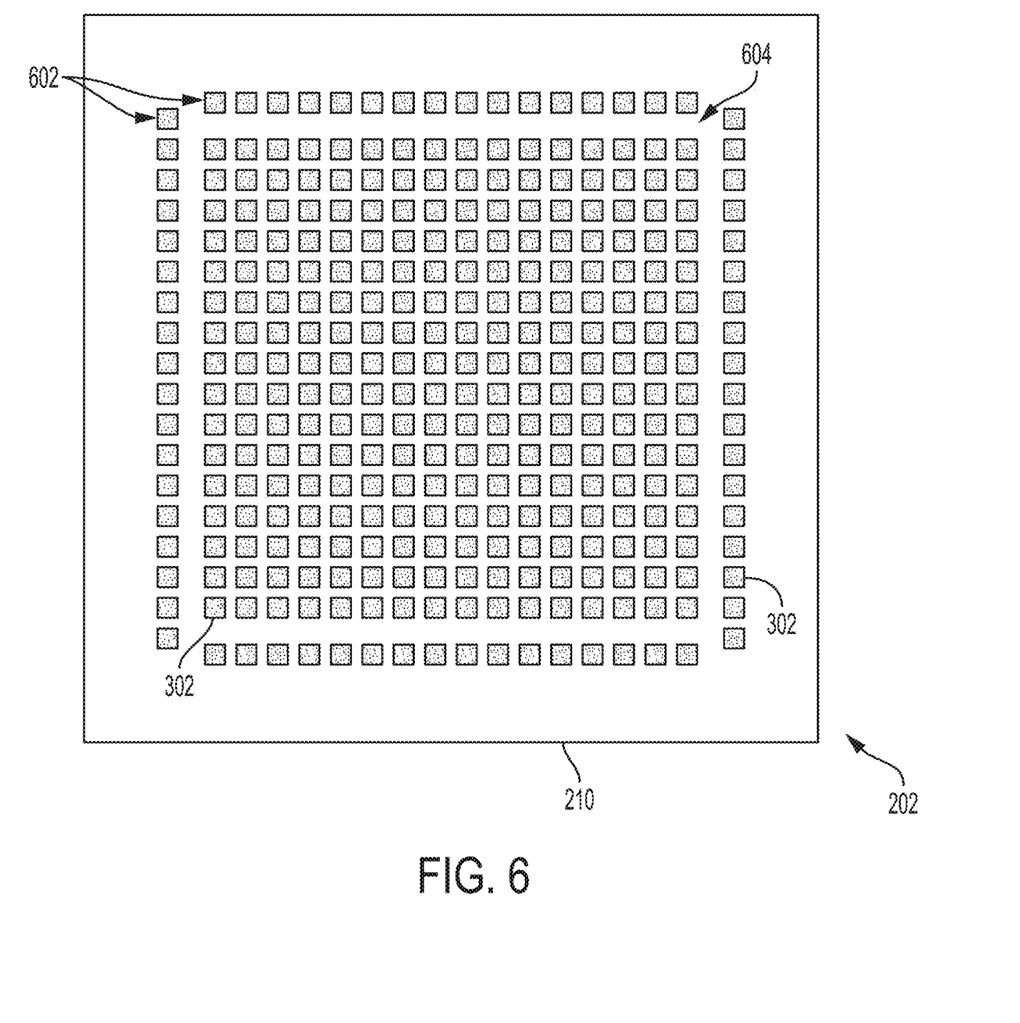
FIG. 6 shows a top view of a detector having array of bumps in accordance with an embodiment.

FIG. 6 shows a bottom-view diagram illustrating semiconductor device 202 and showing how bump contacts 302 may be formed in an array that spans the surface of substrate 210. As shown in FIG. 6, semiconductor device 202 may include a main array 604 of contacts 302 and, optionally, one or more peripheral sets 602 contacts 302.

Main array 604 may be joined, as discussed herein, to corresponding main array contacts (e.g., bump contacts or contact pads) on a readout integrated circuit to provide electrical connections for example to support readout of the IR detector and related control and signal operations. Peripheral sets 602 may be provided, for example, to provide common power supply rail paths or other types of signal paths or shared connections to support the functions of semiconductor devices 202 and/or 204.

Figure 7:
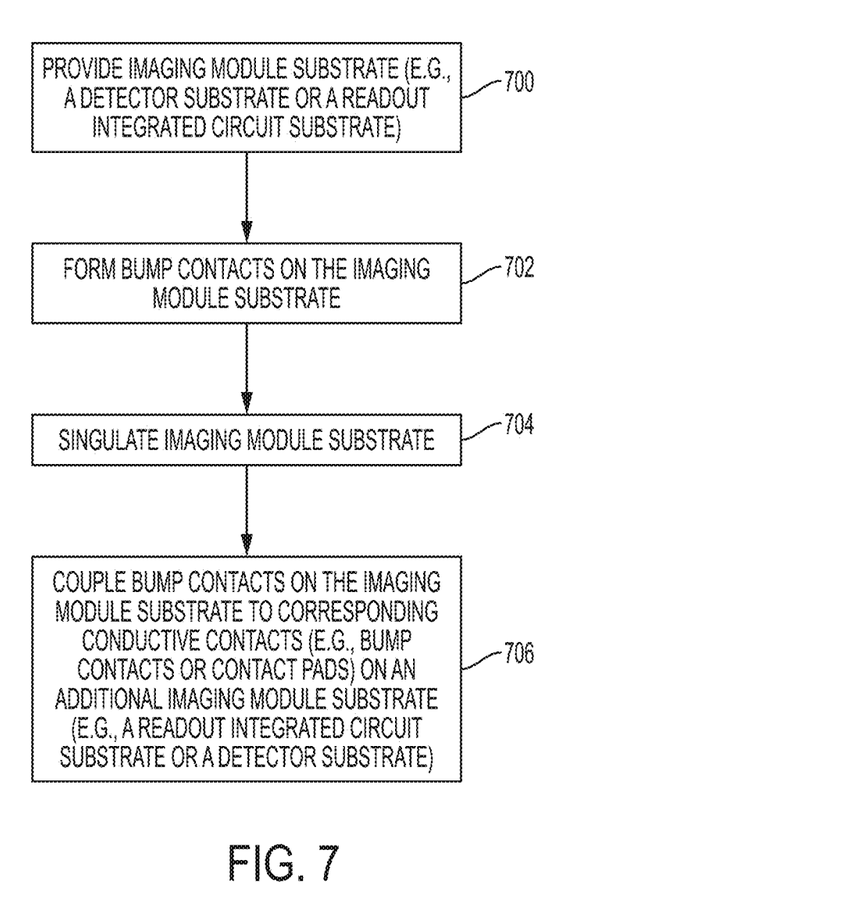
FIG. 7 shows a flow diagram illustrating a method of mating semiconductor devices in accordance with an embodiment.

FIG. 7 is a flowchart of illustrative operations that may be performed for fabricating and assembling a device such an infrared imaging device such as device 200 of FIGS. 2, 3, 4, and/or 5. At block 700, an imaging module substrate (e.g., a detector substrate such as substrate 210 or a readout integrated circuit substrate such as substrate 212) for a detector such as a focal plane array may be provided. The provided substrate may, for example, be a wafer substrate having circuitry for a plurality of infrared detectors. The provided substrate may include electrical contacts on a surface of the substrate and alignment marks such as stepper alignment targets formed on the substrate for aligning a photomask.

At block 702, bump contacts may be formed on the imaging module substrate (e.g., using an etch back process that utilizes the alignment marks). The bump contacts may be formed on the electrical contacts on the surface of the substrate.

At block 704, if the provided substrate is a wafer substrate, the wafer may be diced to singulate individual imaging module devices from the wafer as would be understood by one skilled in the art.

At block 706, the bump contacts formed on the imaging module substrate may be coupled to corresponding conductive contacts (e.g., bump contacts or contact pads) on an additional imaging module substrate (e.g., a readout integrated circuit substrate or a detector substrate).

FIGS. 8A-8H and 9 are a set of diagrams and a flowchart respectively that illustrate a process for forming bump contacts such as contacts 302 as described above in connection with, for example, block 702 of FIG. 7.

FIGS. 8A-8H each show a common portion of an infrared detector wafer at various stages during fabrication of bump contacts 302 on the infrared detector wafer.

Figures 8A, 8B:
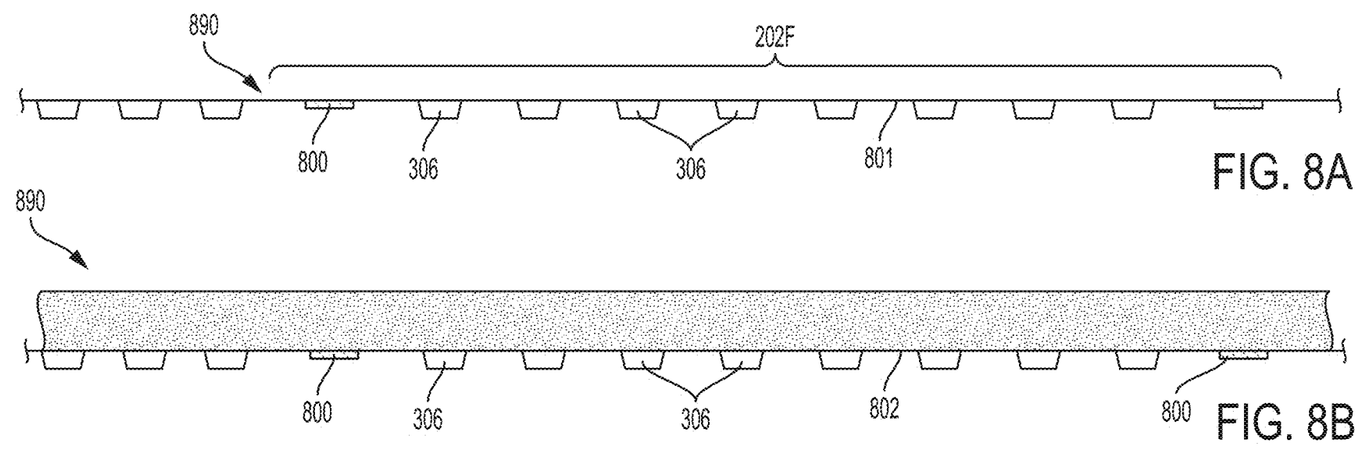
FIGS. 8A-8H show cross-sectional diagrams each illustrating a common portion of a partially fabricated detector substrate at various stages of a fabrication processes in accordance with an embodiment.

As shown in FIG. 8A, a wafer substrate such as infrared detector substrate 890 may be provided with one or more alignment marks 800 and a plurality of surface contacts such as top surfaces of vias 306 on a surface such as surface 801 of the substrate. Vias 306 may be arranged in a plurality of arrays of vias, each array formed within a portion 202F of wafer 890 that will form an infrared detector 202 after bump formation and dicing.

Figure 8C:
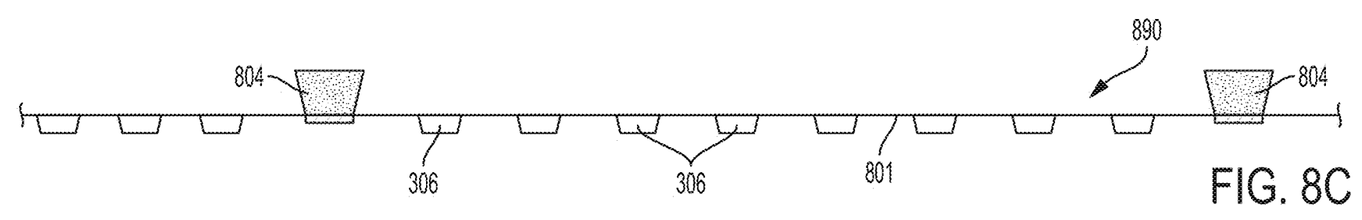

As shown in FIG. 8B, a layer of photoresist 802 may be formed on the surface of substrate 890. As shown in FIG. 8C, photoresist 802 may be patterned so that portions 804 of photoresist layer 802 remain over alignment marks 800 and so that portions of surface 801 away from alignment marks 800 are free of photoresist.

Figure 8D:
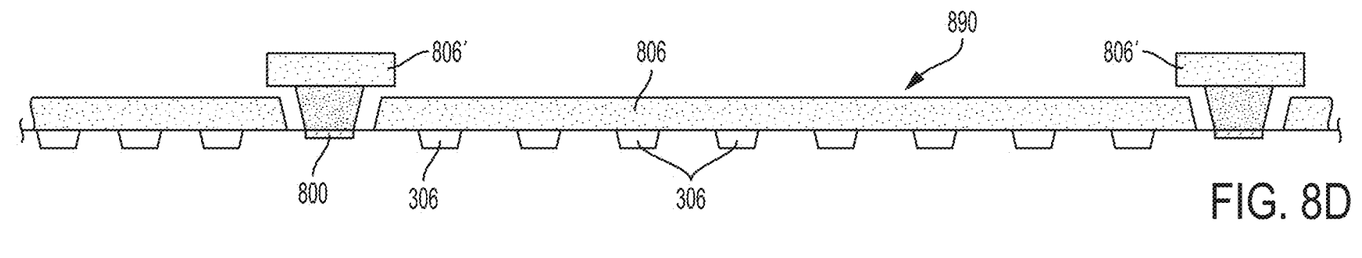
Figure 8E:
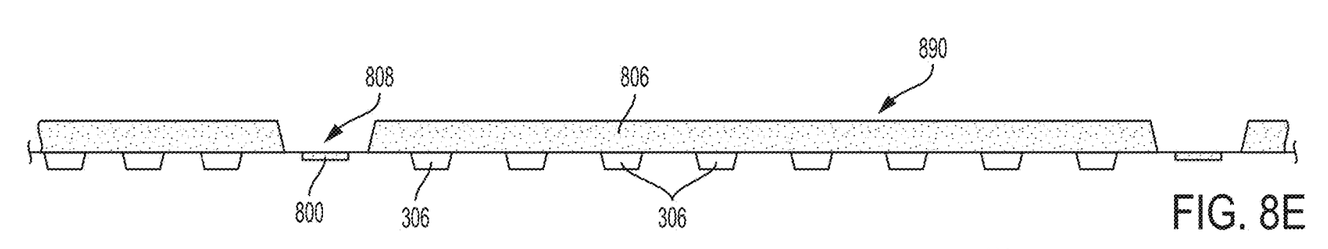

As shown in FIG. 8D, a layer of conductive material 806 (e.g., a layer including one or more layers of indium, gold, titanium, nickel, nickel alloys, platinum, other metals, alloys, or other suitable conductive materials or combinations of materials) may be formed on surface 801 of substrate 890 and over portions 804 of photoresist layer 802. In one embodiment, conductive material 806 may be a sheet of indium having a uniform thickness. In another embodiment, conductive material 806 may include multiple layers such as a multi-metal stack (e.g., a stack of metal sheets including a sheet of titanium, a sheet of nickel, a sheet of a nickel alloy, a sheet of platinum, and/or a sheet of gold) and a sheet of indium having a uniform thickness formed over the multi-metal stack. In another embodiment, conductive material 806 may include multiple layers such as a sheet of indium having a uniform thickness and a multi-metal stack (e.g., a stack of metal sheets including a sheet of titanium, a sheet of nickel, a sheet of a nickel alloy, a sheet of platinum, and/or a sheet of gold) formed over the sheet of indium. In another embodiment, conductive material 806 may include multiple layers such as a first multi-metal stack (e.g., a stack of metal sheets including a sheet of titanium, a sheet of nickel, a sheet of a nickel alloy, a sheet of platinum, and/or a sheet of gold), a sheet of indium having a uniform thickness formed over the first multi-metal stack, and a second multi-metal stack (e.g., a stack of metal sheets including a sheet of titanium, a sheet of nickel, a sheet of a nickel alloy, a sheet of platinum, and/or a sheet of gold) formed over the sheet of indium. As shown in FIG. 8E, portions 804 may then be washed out (e.g., by dissolving portions 804 using a solvent), thereby lifting off portions 806' of conductive material 806 and forming openings 808 over alignment marks 800.

Figure 8F:
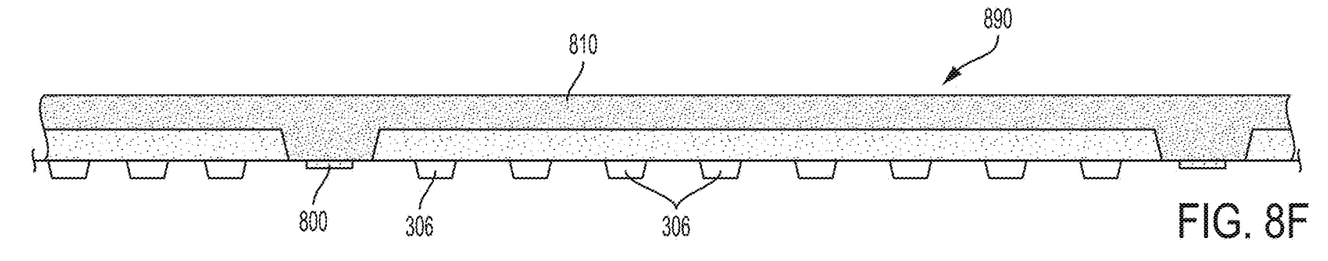
Figure 8G:
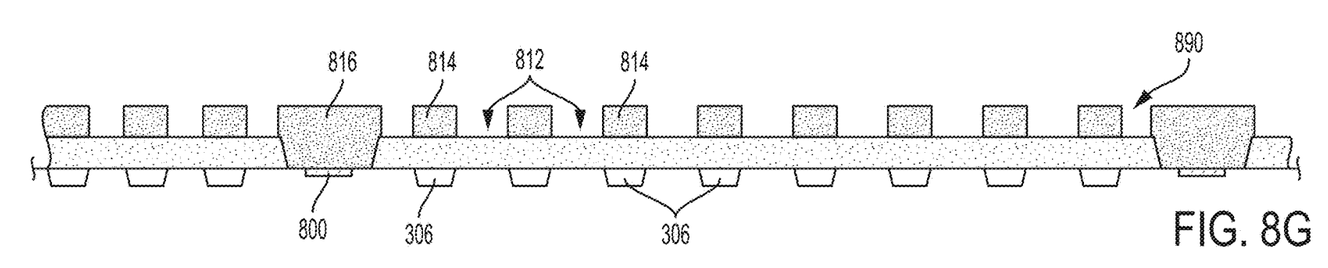

As shown in FIG. 8F, an additional layer of photoresist such as photoresist 810 may then be formed over conductive material 806 and within openings 808. As shown in FIG. 8G, photoresist 810 may then be patterned so that openings 812 in photoresist 810 are formed over portions of conductive material 806 that are to be removed from substrate 890 and so that portions 814 of photoresist 810 remain on portions of conductive material 806 that are to form bump contacts for substrate 890. Patterning photoresist 810 to form openings 812 may include aligning a photomask (not shown) with substrate 890 using alignment marks 800. The photomask may be aligned with substrate 890 by viewing alignment marks 800 through portions 816 of photoresist 810 or, in some embodiments, a clear box may be exposed and etched in photoresist 810 to remove portions 816 of photoresist 810 around alignment marks 800 so that alignment marks 800 can be viewed directly for aligning the photomask to be used for patterning photoresist 810 to form openings 812. In yet other embodiments, alignment marks 800 may be viewed through a portion of substrate 890 and/or the photomask may be aligned in a backside alignment process.

Figure 8H:
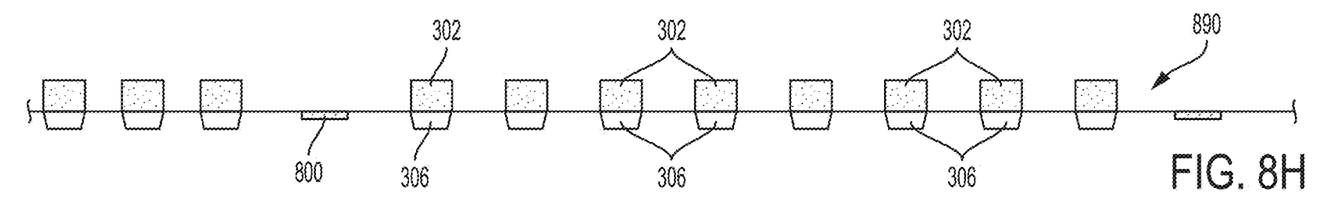

As shown in FIG. 8H, a selective etch of conductive material 806 may then be performed. Conductive material 806 may be etched using, for example, an inductively coupled plasma (ICP) etch process in, for example, an ICP dry etcher using a methane-based etch chemistry in the plasma. This type of methane-based dry etch may allow the mostly or substantially anisotropic etch of a conductive material 806 to be performed at approximately room temperature (e.g., between 15 degree Celsius and 28 degrees Celsius). This can be advantageous as the risk of damage to circuitry or other components of substrate 890 due to high temperatures during the etch process may be reduced. However, this is merely illustrative. In some embodiments, higher temperature etch processes may be used to etch conductive material 806. For example, in one embodiment, a chlorine-based etch of conductive material 806 may be performed at, for example, a temperature between 150 degrees Celsius and 200 degrees Celsius. In another embodiment, a fluorine-based etch of conductive material 806 may be performed.

In one embodiment, an anisotropic etch back process for forming bump contacts on an imaging module substrate as described herein may be a methane-based, chlorine-based, or fluorine-based plasma etch of a layer comprising a metal stack that includes indium on the imaging module substrate. In another embodiment, an anisotropic etch back process for forming bump contacts on an imaging module substrate as described herein may be a chlorine-based plasma etch of a layer that includes a combination of titanium, nickel, nickel alloys, platinum or gold and indium on the imaging module substrate.

Portions 814 of photoresist 810 may then be removed so that bumps 302 remain on contacts 306 on the surface of substrate 890. In embodiments in which substrate 890 is a wafer substrate, the substrate may then be diced to form individual detectors 202, each having an array of bump contacts 302 (e.g., indium bumps or bumps formed from indium and one or additional metal layers such as multi-metal stack elements (e.g., contact metal stacks) each associated with one of the indium bumps and formed between the indium and the detector and/or multi-metal stack elements (e.g., contact metal stacks) each associated with one of the indium bumps and formed with the indium interposed between the multi-metal stacks and the detector) for coupling the detector to a readout integrated circuit).

Figure 9:
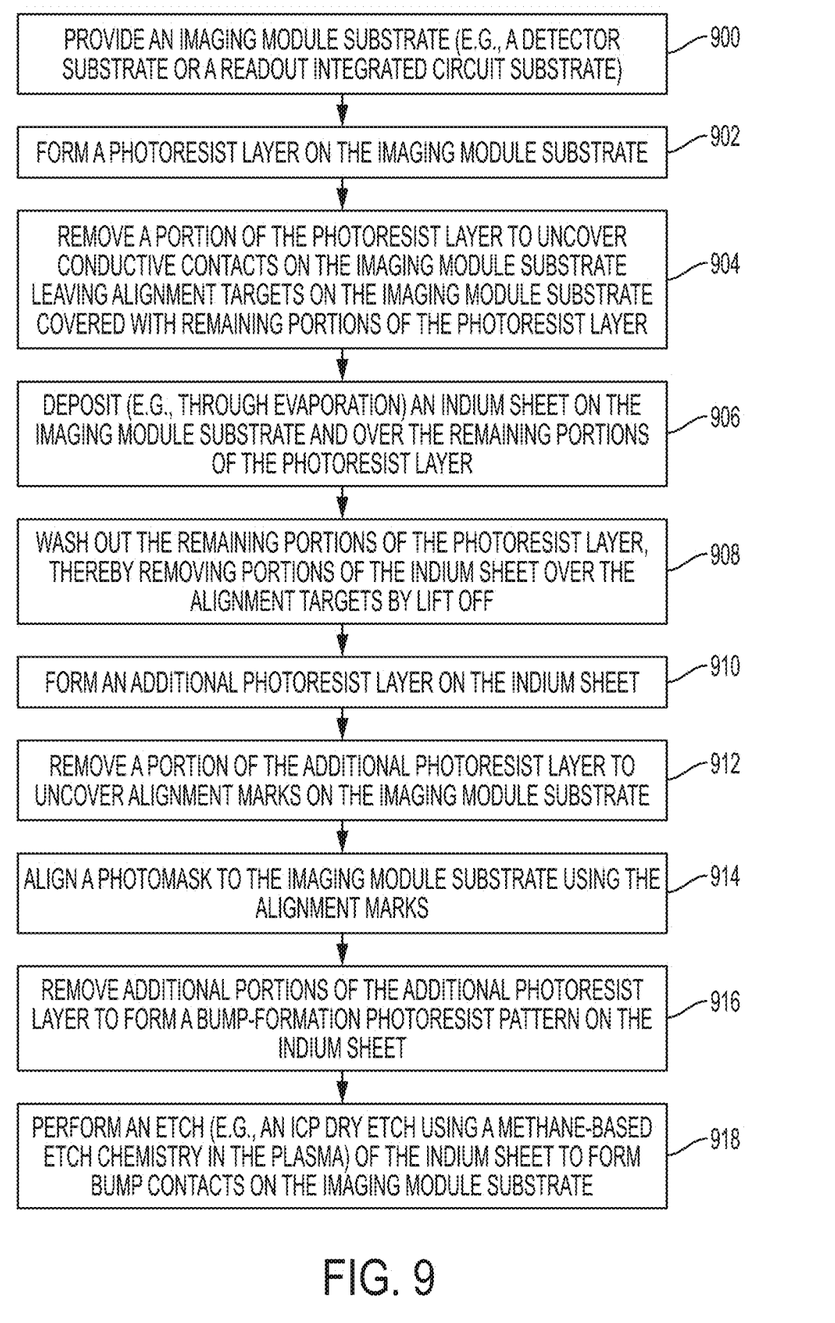
FIG. 9 shows a flow diagram illustrating a method of fabricating bump connectors for a detector in accordance with an embodiment.

FIG. 9 is flowchart of illustrative processes that may be performed for forming bump contacts on a substrate during, for example, fabrication of a detector according to an embodiment.

At block 900, an imaging module substrate (e.g., a detector substrate such as an infrared detector substrate or a readout integrated circuit substrate) may be provided. The imaging module substrate may include a plurality of alignment marks and a plurality of conductive contacts on a surface of the substrate.

At block 902, a photoresist layer may be formed on the imaging module substrate.

At block 904, a portion of the photoresist layer may be removed (e.g., exposed and etched) to uncover the conductive contacts on the imaging module substrate leaving the alignment marks (alignment targets) on the imaging module substrate covered with remaining portions of the photoresist layer.

At block 906, one or more conductive sheets such as an indium sheet and/or one or more additional metal sheets (e.g., one or more metal sheets formed form titanium, nickel, nickel alloys, platinum and/or gold) may be deposited (e.g., in an evaporative process) on the imaging module substrate and over the remaining portions of the photoresist layer.

At block 908, the remaining portions of the photoresist layer may be washed out, thereby removing portions of the indium sheet and/or other deposited metal sheets that are formed over the alignment targets by lift off.

At block 910, an additional photoresist layer may be formed atop the conductive sheet (e.g., the indium sheet). At optional block 912, a portion of the additional photoresist layer may be removed (e.g., exposed and etched) to uncover the alignment marks (alignment targets) on the imaging module substrate.

At block 914, a photomask may be aligned to the imaging module substrate using the uncovered alignment marks. However, this is merely illustrative. In some embodiments, the operations of optional block 912 may be omitted and the photomask may be aligned at block 914 by viewing the alignment marks through portions of the additional photoresist layer.

At block 916, additional portions of the additional photoresist layer may be removed (e.g., exposed and etched) to form a bump-formation photoresist pattern on the conductive sheet (e.g., the indium sheet and/or other metal sheets). The bump-formation photoresist pattern may be a pattern of photoresist portions that each defines an associated one of the bumps to be formed in a subsequent etch of the conductive sheet by shielding the portion of the conductive sheet that is to form the bump from etching materials during the subsequent etch process.

At block 918, one or more etch processes (e.g., an ICP dry etch using a methane-based etch chemistry in the plasma or other etch processes as discussed in connection with FIG. 8H) may be performed to etch through uncovered portions of the conductive sheet (e.g., the indium sheet and/or other metal sheets) anisotropically with the plasma down to the surface of the substrate to form bump contacts on the imaging module substrate according to the bump-formation pattern of the photoresist. Following etching of the conductive sheet, the bump-formation photoresist pattern may be removed.

As noted above, in some embodiments, one or more additional metal sheets may be deposited at block 906 (e.g., prior to deposition of the indium sheet and/or after deposition of the indium sheet). The one or more additional metal sheets may be processed along with the indium sheet at blocks 908, 910, 912, 914, 916, and 918 to form a multi-metal stack below and/or above each bump that facilitates contact and adhesion of the indium. In some embodiments, additional etching processes may be performed to process the one or more additional metal sheets to form the multi-metal stacks. The one or more additional metal sheets may include a titanium sheet, a nickel sheet, a nickel alloy sheet, a platinum sheet, a gold sheet and/or a sheet formed from more than one of titanium, nickel, nickel alloys, platinum, and gold. By etching the one or more additional metal layers and the indium layer (e.g., in a common etch process or separate etch processes) bump contacts including a multi-metal stack including a combination of titanium, nickel, nickel alloys, platinum, and/or gold and an indium layer each having a uniform thickness may be formed. In this way, the etching may form a self-aligned metal stack and an indium bump on corresponding ones of the conductive vias. The vias may be formed in an overglass layer on the substrate. The self-aligned metal stack may be formed below the bumps on corresponding ones of the conductive vias (see, e.g., FIG. 3) in one embodiment.

As examples, the etch processes may include a methane-based, chlorine-based, or fluorine-based plasma etch of a layer including a metal stack including indium on the imaging module substrate or a chlorine-based plasma etch of a layer including a combination of titanium, nickel, nickel alloys, platinum or gold and indium on the imaging module substrate.

Figure 10:
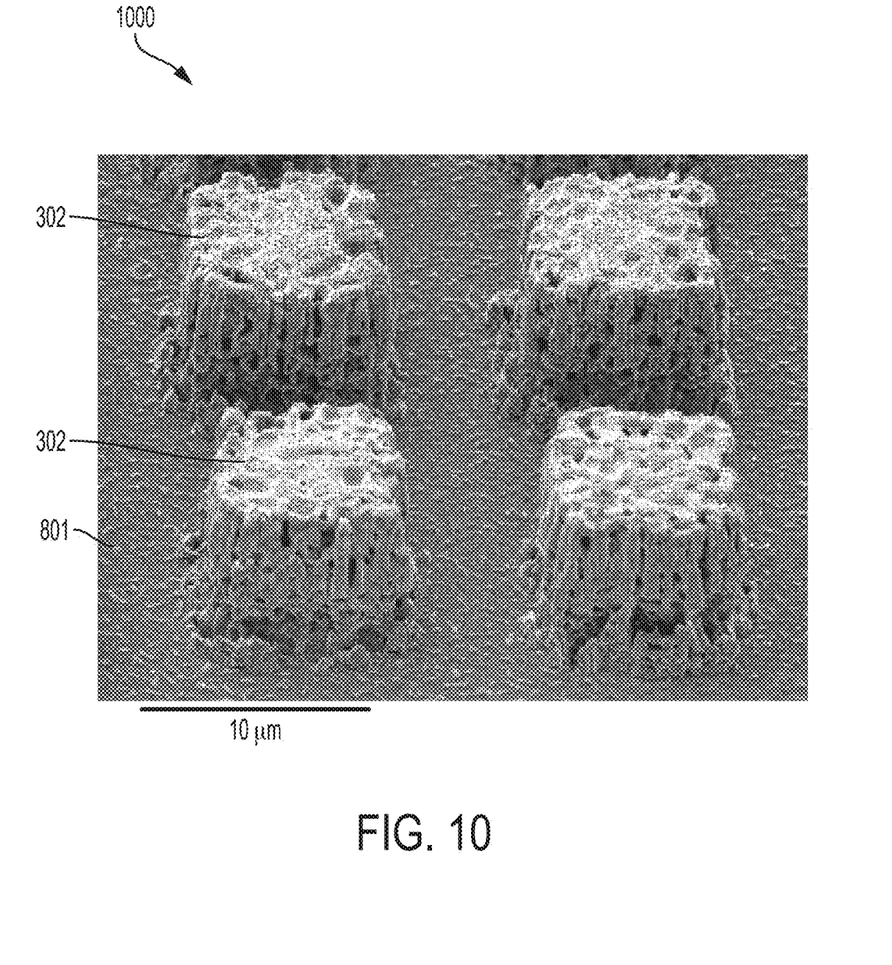
FIG. 10 shows a perspective view of a portion of an array of bump contacts formed on a substrate in accordance with an embodiment.

FIG. 10 shows a perspective view of an exemplary portion 1000 of an array of bump contacts 302 (e.g. indium bumps) formed on a surface of a substrate such as surface 801 (e.g., of substrate 210 of infrared detector 202). As shown in FIG. 10, bumps 302 may have a common, substantially uniform height above surface 801 and may have a width and a length along surface 801 that are less than 10 microns (as an example). Bumps 302 of FIG. 10 have a shape that is substantially rectilinear. However this is merely illustrative. In various embodiments, bumps 302 may have any suitable shape such as a circular shape, an oval shape, a shape having an elongated dimension and a relatively shorter dimension or other suitable shapes for making uniform contact with corresponding contacts on a mating device.

In some embodiments, bumps 302 may have dimensions of width and length that are greater than 10 microns, between 5 microns and 15 microns, between 8 microns and 12 microns, less than 5 microns or other dimensions. As shown in FIG. 10, bumps 302 may be spaced apart by a center-to-center distance of between approximately 8 microns and 20 microns (as an example). Accordingly, infrared detector elements and unit cell readout circuits that are coupled together using bumps 302 may have a corresponding pitch (e.g., a pixel pitch) of between 8 microns and 20 microns, less than 20 microns, less than 30 microns, less than 50 microns, less than 12 microns, less than 10 microns, less than 5 microns, between 5 microns and 20 microns, or greater than 0.5 microns (as examples). In general, bumps 302 may have a uniformity and a size that facilitates relatively high yield production of infrared detectors (or other circuits) with increasingly small pixel pitch.

At pixel pitches of, for example, 12 microns and below, the indium bump geometries and height variations can play a significant role in limiting the yield of a hybridized FPA using conventional approaches. Two main losses of operability due to non-uniformities in conventional detectors can be shorts between pixels (e.g., due to control of the bottom of the bump) and open pixels due to either variation in the bump heights and/or incomplete development of the photoresist at the bottom of the indium bumps.

The systems and methods described herein can, according to one or more embodiments, provide bump contact arrays such as indium bump arrays for hybridized focal plane arrays of infrared detectors in which the bump uniformity is significantly increased, thereby increasing the detector yield. As examples, indium bump arrays may be provided having heights, widths, or other properties that are uniform to within twenty percent, within fifteen percent, within ten percent, within five percent, between five percent and twenty percent or between one percent and fifty percent.

Although the examples of FIGS. 8A-8H, 9, and 10 describe an etch back process for forming bump contacts on an infrared detector, it should be appreciated that the processes described herein may be used to form bump contacts on any suitable semiconductor substrate or device.

Advantageously, the present disclosure provides for improved bump formation for semiconductor devices in which the uniformity of the bumps is enhanced in comparison with conventional bumps by using an etch back bump formation process.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method, comprising:
    providing a substrate having a plurality of contacts on a surface of the substrate and a plurality of alignment marks on the surface;
    forming, in an evaporative process, a layer of conductive material on the surface;
    lifting off parts of the layer of conductive material that are formed over the alignment marks to uncover the alignment marks;
    depositing a layer of photoresist over the alignment marks and the layer of conductive material;
    patterning, using the alignment marks while the layer of photoresist is present over the alignment marks, the layer of photoresist so that portions of the layer of photoresist remain on corresponding portions of the layer of conductive material that are on the contacts; and etching, using an inductively coupled plasma (ICP) etch process, uncovered portions of the layer of conductive material so that remaining portions of the layer of conductive material form conductive bumps on the contacts.

2. The method of claim 1, further comprising:
prior to the forming, depositing and patterning an additional layer of photoresist on the surface so that portions of the additional layer of photoresist remain over the alignment marks;
wherein the forming comprises forming the layer of conductive material on the surface and over the portions of the additional layer of photoresist;
wherein the lifting off comprises lifting off the parts of the layer of conductive material that are formed over the alignment marks by removing the portions of the additional layer of photoresist;
wherein the patterning of the layer of photoresist comprises aligning a photomask with the substrate by viewing the alignment marks; and
wherein the patterning the layer of photoresist comprises patterning the layer of photoresist so that portions of the layer of photoresist remain on the alignment marks.

3. The method of claim 2, further comprising removing the portions of the layer of photoresist following the etching to uncover the alignment marks and wherein the layer of conductive material comprises indium, wherein the aligning the photomask comprises aligning the photomask with the substrate by viewing the alignment marks through portions of the layer of photoresist that are present over the alignment marks.

4. The method of claim 1, further comprising removing the portions of the layer of photoresist following the etching and wherein the layer of conductive material comprises a metal stack comprised of indium and one or more of titanium, nickel, nickel alloys, platinum or gold.

5. The method of claim 1, wherein the substrate comprises an infrared detector substrate, a readout integrated circuit substrate, or a printed circuit substrate, wherein the contacts comprise conductive vias, wherein the conductive vias pass through an overglass layer on the substrate, wherein the infrared detector substrate is formed from a material selected from the group consisting of InSb, HgCdTe, CdTe, InP, GaAs, GaSb, or InGaAs, and wherein the ICP etch process comprises a methane-based dry etch performed at approximately room temperature.

6. The method of claim 1, wherein the substrate comprises a wafer substrate, and wherein each alignment mark is interspersed between at least two of the conductive bumps, and wherein the method further comprises:
dicing the wafer substrate to form a plurality of semiconductor devices each having an array of the conductive bumps; and
coupling the array of the conductive bumps on at least one of the plurality of semiconductor devices to corresponding conductive contacts on an additional semiconductor device.

7. The method of claim 1, further comprising providing an infrared detector package comprising a detector device and a readout integrated circuit mated together by the conductive bumps.

8. The method of claim 7, further comprising providing an infrared camera comprising the infrared detector package.

9. The method of claim 1, wherein the conductive bumps formed by the etching have vertical sidewalls.

10. The method of claim 1, wherein no photoresist material is disposed on the plurality of contacts when the layer of conductive material is formed on the surface.

11. A method, comprising:
providing an imaging module substrate comprising a plurality of alignment marks on a surface of the imaging module substrate;
forming bump contacts on the imaging module substrate using an evaporative deposition process, using an anisotropic etch back process, and using the alignment marks, wherein the anisotropic etch back process comprises an inductively coupled plasma (ICP) etch process, wherein each alignment mark is interspersed between at least two of the bump contacts, wherein the bump contacts are formed at least by patterning, using the alignment marks while a layer of photoresist is present over the alignment marks, the layer of photoresist so that portions of the layer of photoresist remain on corresponding portions of a layer of conductive material that are on the bump contacts; and
coupling at least some of the bump contacts on at least a portion of the imaging module substrate to corresponding conductive contacts on an imaging module component.

12. The method of claim 11, further comprising:
following the forming, dicing the imaging module substrate to form a detector device from the portion of the imaging module substrate,
wherein the imaging module component comprises a readout integrated circuit having the corresponding conductive contacts, wherein the coupling comprises mating an array of the bump contacts on the detector device to the corresponding conductive contacts on the readout integrated circuit, and wherein the corresponding conductive contacts comprise contact pads on the readout integrated circuit.

13. The method of claim 12, further comprising providing an infrared detector package comprising the detector device and the readout integrated circuit.

14. The method of claim 13, further comprising providing an infrared camera comprising the infrared detector package.

15. The method of claim 11, wherein the ICP etch process comprises a methane-based plasma etch of a layer of indium on the imaging module substrate or a chlorine-based plasma etch of the layer of indium on the imaging module substrate.

16. The method of claim 11, wherein the ICP etch process comprises a methane-based, chlorine-based, or fluorine-based plasma etch of a layer comprising a metal stack that includes indium on the imaging module substrate.

17. The method of claim 11, wherein the ICP etch process comprises a chlorine-based plasma etch of a layer comprising indium and one or more of titanium, nickel, nickel alloys, platinum or gold on the imaging module substrate.

18. The method of claim 11, further comprising:
wherein the imaging module substrate comprises an array of infrared detector elements;
wherein the imaging module component comprises an array of unit cell readout circuits; and
providing an imaging device comprising the imaging module substrate coupled to the imaging module component, wherein an array of indium bumps are interposed between the array of infrared detector elements and the array of unit cell readout circuits, wherein each indium bump comprises one of the bump contacts, wherein the unit cell readout circuits are coupled to the infrared detector elements through the indium bumps, wherein each indium bump has a height, and wherein the heights of the indium bumps in the array of indium bumps are uniform to within fifteen percent.

19. The method of claim 18, further comprising:
providing an array of contact metal stacks each associated with the indium bumps and each formed from a combination of contact metal layers including titanium, nickel, nickel alloys, platinum or gold, wherein each contact metal stack comprises one of the conductive contacts on the imaging module component, wherein the array of contact metal stacks is interposed between the array of infrared detector elements and the array of unit cell readout circuits, and wherein each unit cell readout circuit is coupled to the corresponding one of the infrared detector elements through an associated one of the contact metal stacks and the associated one of the indium bumps.

20. The method of claim 18, wherein:
each indium bump further comprises one of the conductive contacts;
the plurality of alignment marks is a first plurality of alignment marks on the imaging module substrate;
each of the first plurality of alignment marks is interspersed between at least two of the bump contacts; and
the imaging device further comprises a second plurality of alignment marks on the imaging module component, wherein each of the second plurality of alignment marks is interspersed between at least two of the conductive contacts.

* * * * *

UNITED STATES PATENT AND TRADEMARK OFFICE
CERTIFICATE OF CORRECTION

PATENT NO. : 10,971,540 B2
APPLICATION NO. : 15/287636
DATED : April 6, 2021
INVENTOR(S) : Richard E. Bornfreund and Joseph H. Durham Page 1 of 1

It is certified that error appears in the above-identified patent and that said Letters Patent is hereby corrected as shown below:

In the Claims

Claim 19, Column 15, Line 8, change "with the indium bumps" to --with a corresponding one of the indium bumps--.

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*